United States Patent [19]

Miyauchi et al.

[11] Patent Number: 4,539,660

[45] Date of Patent: Sep. 3, 1985

[54] SEMICONDUCTOR INTEGRATED CIRCUIT

[75] Inventors: Katsuki Miyauchi, Hino; Tetsuichi Kudo, Tokyo; Osamu Minato, Kodaira; Toshiaki Masuhara, Tokyo; Yoshio Uetani, Ibaragi, all of Japan

[73] Assignees: Hitachi, Ltd., Tokyo; Hitachi Maxell, Ltd., Ohsaka, both of Japan

[21] Appl. No.: 331,278

[22] Filed: Dec. 16, 1981

[30] Foreign Application Priority Data

Dec. 26, 1980 [JP]  Japan ................ 55-188723

[51] Int. Cl.³ ............................................ G11C 11/34
[52] U.S. Cl. ...................................... 365/229; 357/74; 357/75
[58] Field of Search ............... 365/226, 227, 228, 229; 357/74 C, 75

[56] References Cited

U.S. PATENT DOCUMENTS 4,247,913  1/1981  Hiniker et al. .................. 365/228
4,384,350  5/1983  Lee et al. ....................... 365/229

OTHER PUBLICATIONS

Electronics, vol. 50, No. 3, p. 109, Feb. 3, 1977—Bennett.

Primary Examiner—Robert L. Richardson
Attorney, Agent, or Firm—Antonelli, Terry & Wands

[57] ABSTRACT

A nonvolatile memory in which at least one power supply element is carried with an integrated circuit chip containing the memory and connected to power supply terminals of the integrated circuit chip having a memory cell array in which a plurality of memory elements or memory circuits are arrayed.

22 Claims, 8 Drawing Figures

SEMICONDUCTOR INTEGRATED CIRCUIT

BACKGROUND OF THE INVENTION

This invention relates to a semiconductor memory device.

As nonvolatile memories or read only memories (ROMs), an electrically erasable and programable read only memory (EEPROM) and an electrically programable read only memory (EPROM) have been utilized. These memories have disadvantages such as 1 such as the writing time is long and 2 the writing voltage is high, and 3 a two-power-source system is needed. An EEPROM and EPROM of 16 kb is an example. Two power sources of different voltages are required, (25 V) necessary for a programming mode and (5 V) necessary for an access mode. Regarding the writing time, a long time of about 100 seconds is taken for writing all the bits. In addition, the access time is as long as 450 ns, which is about 4 times the access time of a random access memory (RAM) having an equal capacity. This is attributed to the fact that, because of the desire to reduce the cell size, the ROM performs a static operation by the use of only one data line. The EPROM further has the disadvantage that its memory content cannot be electrically erased.

On the other hand, the random access memory (RAM) has a memory capable of writing and reading at high speed in contrast to the read only memory (ROM). Although the memory cell of the RAM has a single data line as in the ROM, the operation thereof is dynamic and various signals can be generated in parellel. Since data can be sensed and amplified at high speed with the signals, the operating speed can be enhanced. When a memory of 16 kb is taken as an example, the access time of the RAM is about ¼ that of the ROM. In addition, the writing time is substantially the same as the access time.

RAMs have the disadvantage that they are volatile memories. More specifically, in case of a dynamic RAM, a one-transistor MOS structure is currently used. With this structure, unless the memory is refreshed once in 2 msec., the memory content cannot be retained. When a power supply has been turned "off", the memory content naturally disappears. In case of a static RAM whose memory cell is a flip-flop structure, the refresh becomes unnecessary. However, when a power supply has been turned "off" to permit no current to be supplied to the memory cell, a memory content cannot be retained as in the dynamic RAM.

SUMMARY OF THE INVENTION

It is accordingly an object of this invention to provide a semiconductor memory which has a high operating speed as a RAM and which is nonvolatile as a ROM.

The semiconductor memory of this invention for accomplishing the object is a nonvolatile semiconductor memory containing a power supply element, in which the power supply element such as a battery, capacitor and solar battery is installed in the volatile semiconductor memory to render the latter nonvolatile.

The fields of utilization of the nonvolatile semiconductor memory according to this invention are a memory as part of a computer terminal equipment which uses a single small-sized power source, a microcomputer or a small-sized desk calculator which requires a nonvolatile memory, etc.

DESCRIPTION OF THE PREFERRED EMBODIMENTS

A nonvolatile semiconductor memory containing a power supply element according to this invention will be described in detail in conjunction with embodiments.

Embodiment 1

Figure 1:
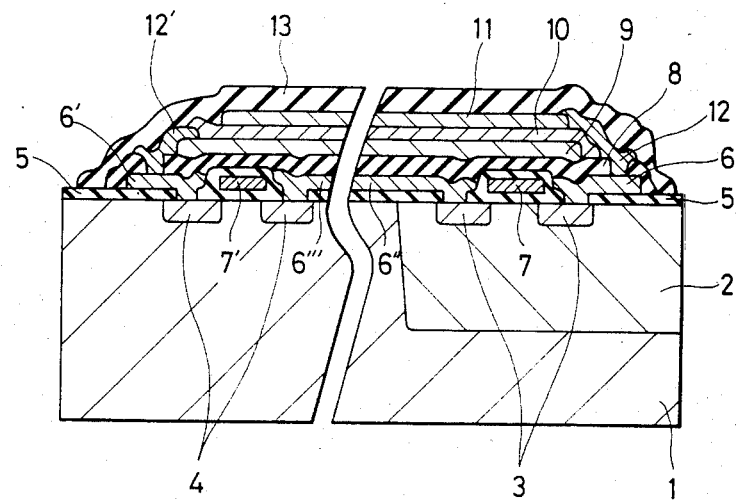
FIG. 1 is a sectional view of the structure of an embodiment of this invention in which a C-MOS·RAM is laminated with a battery.

An example in which a fully solid-state battery is employed as a power supply element to laminate the chip of a RAM will be described with reference to FIG. 1. In FIG. 1, a passivation layer 8 of $Si_3N_4$ or the like is disposed on the surface of a C-MOS static RAM which is constructed of a silicon substrate of the n-type conductivity 1, a well region of the p-type conductivity 2, $n^+$-type conductivity regions 3, $p^+$-type conductivity regions 4, an insulating layer 5, metal interconnections 6, 6', 6" and 6''' and gate electrodes 7 and 7'. On the layer 8, there are successively formed a conductive layer 9 for the anode or cathode of the battery, a solid electrolyte layer 10 and a conductive layer 11 for the cathode or anode of the battery. $TiS_2$, $VSe_2$ or the like is used as the anode material of the battery, while an Li—Al alloy, Li—Si alloy or the like is used as the cathode material. Used as the substance of the solid electrolyte is an $Li_4SiO_4$—$Li_3PO_4$ compound, $Li_3N$—LiI compound, $Li_3N$—LiI—LiOH compound or the like. The connection between the battery and the RAM chip is such that an earth terminal $V_{ss}$ 6 and a power supply terminal $V_{cc}$ 6' of a circuit integrated within the semiconductor are respectively connected to the anode and cathode through conductors 12 and 12'. Lastly, a passivation layer 13 is formed, and the chip is bonded and then packaged.

Owing to this structure, a cell capacity corresponding to the anode and cathode active materials of the battery determines the retention time of the RAM. For example, in the case where a battery having a discharge capacity of 7 mAh is connected to a 16 kb C-MOS static RAM, a memory content is retained for about 30 days. In addition, since the battery is fully solid, it is stable and can possess a lifetime of at least 5 years. Further, since the battery indicated in the present embodiment is a secondary cell, it is charged while an external power source is turned "on", and the memory content can be retained by the discharge of the battery after the external power source has been turned "off".

Figure 2A:
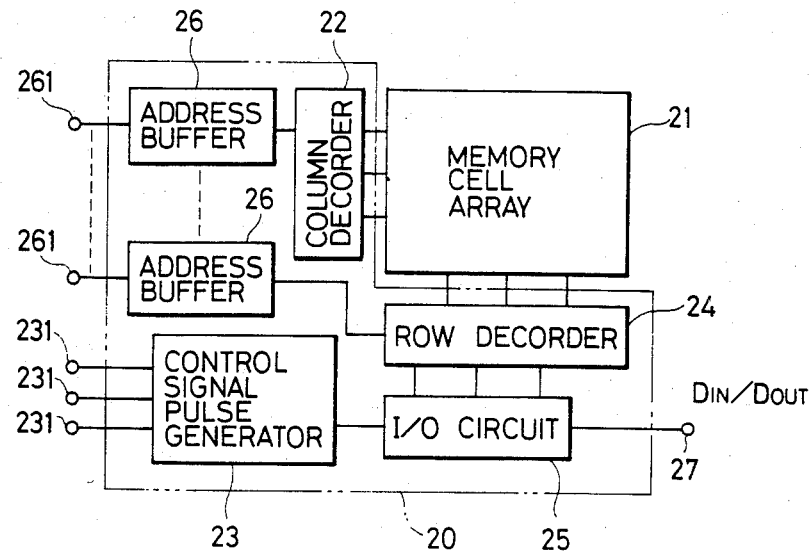
FIG. 2A is a block diagram showing a circuit of a RAM.
Figure 2B:
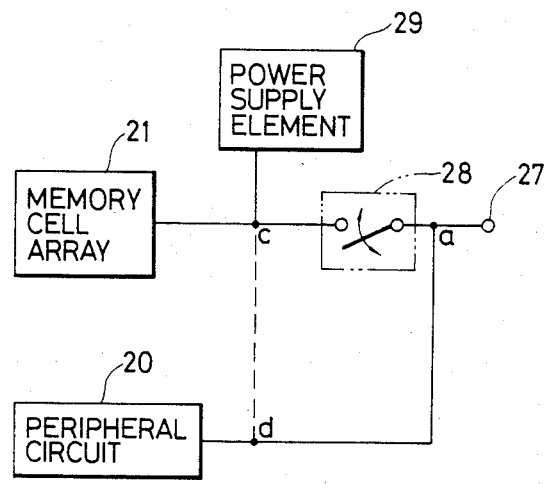
FIG. 2B is a block diagram showing a circuit of an embodiment of this invention.

Now, a circuit for connecting the RAM and the battery in the present arrangement will be described with reference to block diagrams (FIGS. 2A and 2B). As shown in the block diagram of FIG. 2A, the fundamental arrangement of the static RAM can be depicted by a memory cell array 21 and a peripheral circuit 20 including 22: column decoder, 23: control signal pulse generator, 24: row decoder, 25: I/O circuit, 26: address buffer. In order to retain the memory content, basically current may be supplied from the power supply element to only the memory cell array. The construction of this invention for using the battery is shown in as a block diagram in FIG. 2B. In this construction, when the external power source terminal 27 is in its closed state, the memory cell array 21 and the peripheral circuit 20 are operated in their operating states by a switching control circuit 28. The battery 29 is charged. On the other hand, when the external power source is in its open state, current is supplied to the memory cell array 21 by the battery 29 through the switching control circuit 28 which retains the memory content so that the RAM becomes nonvolatile.

When the peripheral circuit has a circuit arrangement which does not consume current in a stand-by condition (for example, C-MOS circuit), it is also allowed to connect the power supply terminals c and d of the memory cell array and the peripheral circuit with the battery and to disconnect the path between the points a and d.

The switching control circuit 28 can be constructed of a combination of a supply voltage (current) sensing circuit, a control circuit and a switching circuit. It may well be interlocked with a power supply switch or be made a mere switch.

Embodiment 2

Figure 3:
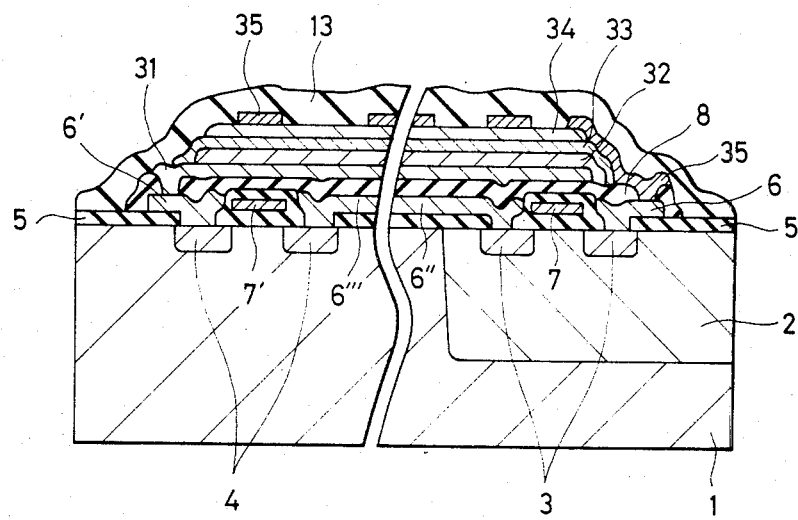
FIG. 3 is a sectional view of the structure of an embodiment of this invention in which a C-MOS·RAM is laminated with a solar battery.

An example in which a nonvolatile RAM is constructed by forming a p-i-n multilayer solar cell on a memory chip as a power supply element will be described in reference to FIG. 3.

A current collector 31 is formed on a C-MOS static RAM chip which has a passivation layer 8 as in Embodiment 1. Subsequently, using amorphous silicon layers or polycrystalline silicon layers, semiconductor thin layers of the p-type 32, the i-type 33 and the n-type 34 are formed to construct the solar battery. Subsequently, a current collector 35 and a passivation film 13 are formed. After bonding the resultant chip, it is sealed in a package provided with a transparent window. A nonvolatile RAM is obtained with this construction. Here, the earth terminal $V_{ss}$ 6 and power source terminal $V_{cc}$ 6' of the circuit integrated in the semiconductor are respectively connected with the current collectors of the solar cell.

The construction of the C-MOS static RAM chip is the same as in Embodiment 1. By dividing the solar cell into several regions on the chip and connecting them in series, any desired retention voltage can be generated.

With the element of the present embodiment, a current of at least 500 $\mu A/cm^2$ can be generated by a light source such as the sun or light of an electric lamp. In the presence of such light, therefore, the RAM functions on a semipermanent basis.

Embodiment 3

Figure 4:
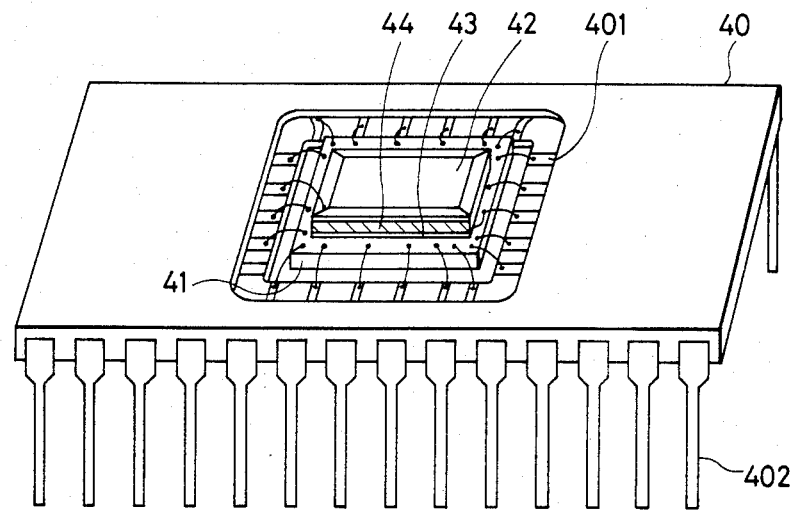
FIG. 4 is an exterior view of an embodiment of this invention in the state in which a small-sized battery prepared separately has been stacked and bonded onto a silicon chip.

With reference to FIG. 4, an example in which a conventional sealed battery such as lithium battery is bonded on a memory chip of the construction of FIG. 1 or the like and silver-zinc battery is described.

Figure 5:
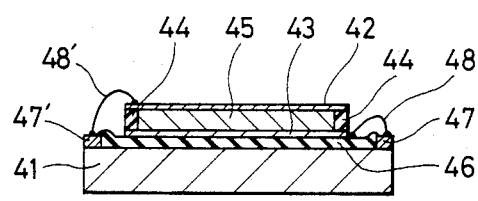
FIG. 5 is a partial sectional view of the silicon chip and the small-sized battery in FIG. 4.

On a memory chip 41 having already been subjected to the surface passivation, any of the aforecited batteries is fixed and the bonding of the memory chip and the bonding between the battery and the chip is carried out. Lastly, the resultant structure is packaged to construct the nonvolatile RAM package 40 (401: lead, 402: pin). Here, numerals 42 and 43 designate the anode and cathode collectors of the battery which are connected with the power supply terminal $V_{cc}$ and earth terminal $V_{ss}$ of the circuit integrated in the memory chip, respectively. Numeral 44 indicates the sealing material of the battery. FIG. 5 is a view of one section of a thin type battery fixed on the memory chip. Here, numeral 41 indicates a silicon integrated circuit chip, numerals 42 and 43 the anode and cathode collectors of the battery, numeral 44 the sealing material of the battery, numeral 45 is the body of the battery, numeral 46 a passivation film, numeral 47 a bonding pad, and numerals 48 and 48' connecting wires.

For example, in the case where a battery having a discharge capacity of 7 mAh is connected to a 16 kb static RAM, a memory content is retained for about 30 days. In the case of employing a fully solid-state battery, a long life of at least 5 years is attained.

Embodiment 4

Figure 6:
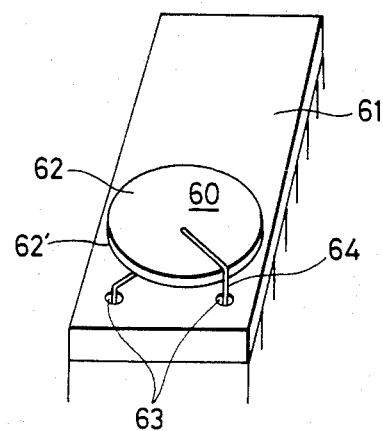
FIG. 6 is an exterior view of an embodiment of this invention in which a power supply element is stacked on a RAM package.
Figure 7:
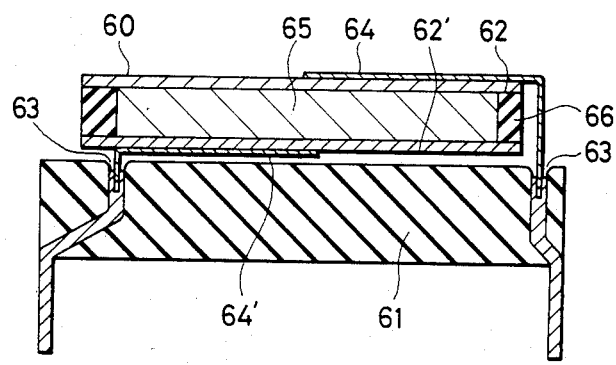
FIG. 7 is a partial sectional view of the embodiment in FIG. 6.

A nonvolatile RAM in which a power supply element is added to a RAM having been packaged will be described with reference to FIGS. 6 and 7. FIG. 6 is an exterior view, and FIG. 7 is a sectional view. A nonvolatile RAM can be constructed in such a way that a power supply element 60 is connected to a memory package 61 having an outer socket 63. In these figures, numerals 62 and 62' designate the anode and cathode collectors of the power supply element respectively, numerals 64 and 64' leads, numeral 65 a battery body composed of an electrolyte and anode and cathode materials, and numeral 66 a battery sealing material. In these figures, the power supply element 60 is connected with the retention power source terminals of the RAM through the socket 63.

With the present invention, the power supply element may be added to only the device requiring the information retention, and the versatility increases sharply.

As the power supply element, there is employed at least one of a silver-zinc battery, a lithium battery, a solid-state lithium battery, a large-capacity capacitor (for example, electric double layer-capacitance type capacitor), a solar battery, etc.

The position on the package that the power supply element is to be mounted, is optional.

Embodiment 5

A solid electrolyte capacitor is employed as the power supply element of Embodiment 1 or 3. The solid electrolyte capacitor is a large-capacity capacitor which uses a solid electrolyte such as $Rb_2Cu_8I_3Cl_7$ and $Li_4SiO_4$—$Li_3PO_4$.

In the case of using a capacitor as the power supply element, the ways of fabricating and connecting the memory and the capacitor and the operations of the memory are the same as the case of using the battery. That is, the circuitry has the same arrangement as in FIG. 2B.

The nonvolatile RAM according to this invention has the memory contents of its individual memory chips retained. Therefore, it has the advantages that a RAM can be freely sampled and moved from a memory board and can be shipped in the state in which an appropriate memory content is retained. Moreover, a useful memory system which is high in both the writing and reading speeds and which is nonvolatile as stated before can be constructed by the use of the RAM according to this invention.

In each of the foregoing embodiments, the RAM has been referred to as the memory of this invention. However, the invention is not restricted thereto and is applicable to other volatile memories such as for example, a content addressable memory (CAM), a serial memory and an analogue memory. The invention is applicable, not only to a MOS type memory, but also to a bipolar type memory.

What is claimed is:

1. A semiconductor integrated circuit comprising an integrated circuit chip including a memory part in which a plurality memory elements or memory circuits are arrayed, and at least one power supply element carried with said integrated circuit chip and connected to power supply terminals of said integrated circuit chip.

2. A semiconductor memory according to claim 1, wherein said power supply element is a battery.

3. A semiconductor memory according to claim 2, wherein said power supply element is a fully solid-state battery.

4. A semiconductor memory according to claim 3, wherein said power supply element is a fully solid-state secondary battery.

5. A semiconductor memory according to claim 4, wherein said power supply element is a solid-state lithium battery.

6. A semiconductor memory according to claim 2, wherein said power supply element is a battery having already been sealed, and wherein said battery is stacked on said integrated circuit and has its electrodes connected to said power supply terminals of said integrated circuit chip.

7. A semiconductor memory according to claim 6, wherein said integrated circuit chip is placed in a package having an outer socket, and said electrodes of said battery and said power supply terminals of said integrated circuit chip are connected by inserting electrode leads of said battery into said outer socket.

8. A semiconductor memory according to claim 2, wherein said power supply element is a solar battery.

9. A semiconductor memory according to claim 1, wherein said power supply element is a capacitor.

10. A semiconductor memory according to claim 9, wherein said capacitor is a solid electrolyte capacitor.

11. A semiconductor memory according to claim 1, 2 or 9, wherein said memory part disposed in said integrated circuit chip constitutes a random access memory.

12. A semiconductor memory according to claim 1, 2 or 9, wherein said memory part disposed in said integrated chip constitutes a content addressable memory.

13. A semiconductor memory according to claim 1, 2 or 9, wherein said memory part disposed in said integrated chip constitutes a serial memory.

14. A semiconductor memory according to claim 1, 2 or 9, wherein said memory part disposed in said integrated chip constitutes an analogue memory.

15. A semiconductor integrated circuit comprising an integrated circuit chip including a memory part in which a plurality of memory elements or memory circuits are arrayed, and at least one fully solid-state battery connected to power supply terminals of said integrated circuit chip wherein said solid-state battery is a lithium battery, the solid electrolyte substance of which is at least one selected from the group consisting of a $Li_4SiO_4$—$Li_3PO_4$ compound, a $Li_3N$—$LiI$ compound and an $Li_3N$—$LiI$—$LiOH$ compound.

16. A semiconductor memory according to claim 15, wherein said solid-state lithium battery comprises a first electrode layer disposed on said integrated circuit chip through an insulating film, a layer of said solid electrolyte substance disposed on said first electrode layer, and a second electrode layer disposed on the solid electrolyte substance layer, and wherein said first electrode layer and said second electrode layer are respectively connected to the first and second power supply terminals of the semiconductor integrated circuit chip.

17. A semiconductor integrated circuit comprising an integrated circuit chip including a memory part in which a plurality of memory elements are configured in an array which is connected to power supply terminals to which is connected a biasing potential for maintaining a desired binary data state written within each of said individual elements and a power supply formed integrally within said integrated circuit and having different reference potentials connected respectively to different terminals for providing said biasing potential when said terminals are disconnected from an external power source, said power supply element being formed from multiple layers disposed in proximity to the plurality of memory elements with a pair of said layers being individually connected to different terminals and said integrated circuit being covered with a passivation layer to seal said memory elements and said multiple layers.

18. A semiconductor memory according to claim 17, wherein said power supply element is a solid-state secondary battery.

19. A semiconductor memory according to claim 18, wherein said solid-state secondary battery is a lithium battery.

20. A semiconductor memory according to claim 17, wherein said power supply element is a solar cell.

21. A semiconductor integrated circuit comprising an integrated circuit chip including a memory part in which a plurality of memory elements are configured in an array which is connected to power supply terminals to which is connected a biasing potential for maintaining a desired binary state written within each of said elements and a power supply bonded directly to said integrated circuit chip having a pair of terminals respectively connected to said different power supply terminals for providing said biasing potential when said power supply terminals are disconnected from an external power supply.

22. A semiconductor integrated circuit comprising an integrated circuit chip including a memory part in which a plurality of memory elements are configured in an array which is connected to power supply terminals to which is connected a biasing potential for maintaining a desired binary data state written within each of said individual elements, a pair of sockets for respectively electrically connecting to said power supply terminals for permitting the external connection of a secondary power source to said terminals, and a battery having a pair of leads, connected to different reference potentials within said battery, which engages said sockets for providing said biasing potential when said terminals are disconnected from an external power source used for general operation of the integrated circuit chip.

* * * * *